(12) United States Patent
Kumar et al.

(10) Patent No.: US 10,787,737 B2
(45) Date of Patent: Sep. 29, 2020

(54) DOWNHOLE DRILL BIT WITH COATED CUTTING ELEMENT

(71) Applicant: National Oilwell DHT, L.P., Conroe, TX (US)

(72) Inventors: Anil Kumar, Conroe, TX (US); Russell C. Gilleylen, Spring, TX (US); Rajagopala N. Pillai, Pasadena, TX (US); Wei Liu, Conroe, TX (US)

(73) Assignee: NATIONAL OILWELL DHT, L.P., Conroe, TX (US)

( * ) Notice: Subject to any disclaimer, the term of this patent is extended or adjusted under 35 U.S.C. 154(b) by 7 days.

(21) Appl. No.: 15/769,115

(22) PCT Filed: Nov. 9, 2016

(86) PCT No.: PCT/US2016/061110
§ 371 (c)(1),
(2) Date: Apr. 18, 2018

(87) PCT Pub. No.: WO2017/083369
PCT Pub. Date: May 18, 2017

(65) Prior Publication Data
US 2018/0305810 A1    Oct. 25, 2018

Related U.S. Application Data

(60) Provisional application No. 62/254,568, filed on Nov. 12, 2015.

(51) Int. Cl.
*C23C 16/32* (2006.01)
*E21B 10/567* (2006.01)
(Continued)

(52) U.S. Cl.
CPC ............ *C23C 16/32* (2013.01); *C23C 16/045* (2013.01); *C23C 16/27* (2013.01); *C23C 16/30* (2013.01);
(Continued)

(58) Field of Classification Search
USPC .......... 428/336, 409, 457, 698; 51/307, 309; 427/577
See application file for complete search history.

(56) References Cited

U.S. PATENT DOCUMENTS

| 4,990,403 A | 2/1991 | Ito |
| 6,740,393 B1 * | 5/2004 | Massler ............... C23C 16/029 428/408 |

(Continued)

FOREIGN PATENT DOCUMENTS

| WO | 00/28106 A1 | 5/2000 |
| WO | 2013/078161 A1 | 5/2013 |

(Continued)

OTHER PUBLICATIONS

PCT/US2016/061110 International Search Report and Written Opinion dated Jan. 24, 2017 (16 p.).

(Continued)

*Primary Examiner* — Archene A Turner
(74) *Attorney, Agent, or Firm* — Conley Rose, P.C.

(57) ABSTRACT

A coating for a diamond table of a cutting element is described. The coating is employed to fill a plurality of voids left by the manufacturing process that compromise the integrity of the cutting element and the associated downhole tooling. The coating may comprise diamond nanoparticles in a metal matrix and may be used with or without a binder layer applied directly to the diamond table, the coating may alternatively be a pure diamond film coating, and may be employed to fill voids left by the manufacturing process.

20 Claims, 10 Drawing Sheets

(51) Int. Cl.
*C23C 16/04* (2006.01)
*C23C 16/27* (2006.01)
*C23C 16/30* (2006.01)
*C23C 30/00* (2006.01)
*C23C 26/02* (2006.01)
*C23C 28/04* (2006.01)

(52) U.S. Cl.
CPC ............ *C23C 26/02* (2013.01); *C23C 28/044* (2013.01); *C23C 30/005* (2013.01); *E21B 10/567* (2013.01)

(56) References Cited

U.S. PATENT DOCUMENTS

| | | |
|---|---|---|
| 8,858,733 B2 | 10/2014 | Pillai et al. |
| 2006/0199013 A1 | 9/2006 | Malshe et al. |
| 2010/0108403 A1 | 5/2010 | Keshavan |
| 2010/0200305 A1 | 8/2010 | Griffin et al. |
| 2011/0167734 A1 | 7/2011 | Jiang et al. |
| 2011/0212303 A1 | 9/2011 | Fuller et al. |
| 2012/0018223 A1 | 1/2012 | Setlur et al. |
| 2012/0222362 A1 | 9/2012 | Li et al. |
| 2013/0068449 A1 | 3/2013 | Pillai et al. |
| 2013/0180181 A1* | 7/2013 | Nixon ................... B24D 3/04 51/309 |
| 2015/0041224 A1 | 2/2015 | DiGiovanni |

FOREIGN PATENT DOCUMENTS

| | | |
|---|---|---|
| WO | 2013/098085 A1 | 7/2013 |
| WO | 2014/003751 A1 | 1/2014 |
| WO | 2014/036283 A1 | 3/2014 |
| WO | 2014/161816 A2 | 10/2014 |

OTHER PUBLICATIONS

European Extended Search Report dated Apr. 4, 2019, for European Application No. 16864903.6 (19 p.).

* cited by examiner

DOWNHOLE DRILL BIT WITH COATED CUTTING ELEMENT

CROSS-REFERENCE TO RELATED APPLICATIONS

This application is a 35 U.S.C. § 371 national stage application of PCT/US2016/061110 filed Nov. 9, 2016, and entitled "Downhole Drill Bit With Coated Cutting Element," which claims priority to U.S. Provisional Patent App. No. 62/254,568, "Downhole Drill Bit With Coated Cutting Element," filed Nov. 12, 2015, incorporated herein in their entirety for all purposes.

STATEMENT REGARDING FEDERALLY SPONSORED RESEARCH OR DEVELOPMENT

Not applicable.

BACKGROUND

This present disclosure relates generally to drilling equipment used in wellsite operations. More specifically, the present disclosure relates to drill bits and cutting elements (and related materials and components) used for drilling wellbores.

Various oilfield operations may be performed to locate and gather valuable downhole fluids. Oil rigs are positioned at wellsites and downhole tools, such as drilling tools, are deployed into the ground to reach subsurface reservoirs. The drilling tools may include a drill string with a bottom hole assembly, and a drill bit advanced into the earth to form a wellbore. The drill bit may be connected to a downhole end of the bottom hole assembly and driven by drillstring rotation from the surface and/or by mud flowing through the drilling tool.

The drill bit may be a fixed cutter drill bit with polycrystalline diamond compact (PDC) cutting elements. The cutting elements may be used to engage a wall of the wellbore and cut away portions to extend the wellbore. Examples of drill bits and/or cutting elements are provided in US Patent/Application Nos. 2013/0068449, 2012/0222362, 8858733, and PCT Application Nos. WO2014003751, 201416163, 2010/0200305, 201110212303, 2012/0018223, and US2011/0167734 and PCT Patent Application No. WO 2014/036283, the entire contents of which are hereby incorporated by reference herein.

BRIEF DESCRIPTION OF THE DRAWINGS

So that the above recited features and advantages can be understood in detail, a more particular description, briefly summarized above, is contained herein with reference to the embodiments thereof that are illustrated in the appended drawings. It is to be noted, however, that the examples illustrated are not to be considered limiting of its scope. The figures are not necessarily to scale and certain features and certain views of the figures may be shown exaggerated in scale or in schematic in the interest of clarity and conciseness.

SUMMARY

In an embodiment, a method of forming a cutting element, comprising: disposing a coating on an least one surface of a cutting element, wherein the at least one surface comprises a plurality of voids in a diamond table, and wherein disposing the coating fills at least some of the plurality of voids on the at least one surface.

In an embodiment, a cutting element comprising: a polycrystalline diamond table in contact with a tungsten carbide substrate; a coating disposed on the polycrystalline diamond table, wherein the coating comprises a plurality of diamond nanoparticles disposed in a matrix.

In an embodiment, a downhole drilling tool comprising: a cutting element comprising: a polycrystalline diamond table comprising a plurality of voids; a coating disposed at a thickness from about 0.5 µm to about 1.0 mm on the polycrystalline diamond table, wherein the coating fills at least some of the plurality of voids.

DETAILED DESCRIPTION

In the following description, numerous details are set forth to provide an understanding of the present disclosure. However, it will be understood by those skilled in the art that the present disclosure may be practiced without these details and that numerous variations or modifications from the described embodiments are possible.

Components used in downhole drilling operations may operate under high temperature, high pressure, and/or corrosive conditions. The manufacture of cutting elements, for example, those comprising a diamond table of polycrystalline or nanocrystalline structure, may have catalysts employed during manufacture, these catalysts are desirable to remove before assembling the cutting elements into the downhole tooling. The catalysts, including cobalt, may enhance the transition of diamond to graphite at a lower temperature, and thus may damage the performance of the cutting elements during use. In addition, the thermal expansion coefficient of the catalysts is much higher than diamond, which may lead to the breakdown of the diamond structures. Thus, some cutting elements employed in downhole drilling operations may undergo a leaching operation to remove some or all of these impurities. This leaching operation may leave a plurality of voids in a polycrystalline or nanocrystalline diamond table of the cutting element. These voids may reduce the thermal conductivity of the cutting elements and/or present integrity and lifespan concerns, and may therefore not be a desirable resulting effect of the manufacturing process. Discussed herein are systems and methods of applying a coating to wellsite equipment, such as a diamond table of a cutting element of a drill bit. The coating may be deposited by chemical vapor deposition (CVD), plating, plasma-activated vapor deposition (PAVD), or by other known or unknown deposition methods and may be disposed in one or more layers of varying or similar thickness and composition (elemental and/or weight percent). The coating may be a thermally stable, high in abrasion resistance, and compatible with a polycrystalline diamond structures, for example, on leached cutting elements (e.g., shallow or deep leached cutting elements), such that it fills at least a portion of the voids formed as a result of the leaching process in order to increase the thermal conductivity and hardness of the cutting element. In some embodiments, the hardness of a cutting element may be increased up to 50% by employing an embodiment of the disclosed coating as compared to the hardness of an uncoated cutting element. The abrasion resistance may also increase by at least 40% subsequent to coating, as compared to the abrasion resistance of an uncoated cutting element.

In an embodiment, the coating may comprise a binder layer disposed over at least one layer comprising diamond nanoparticles dispersed in a matrix or a metal matrix, for example, a nickel-phosphate (Ni—P) material. In an embodiment, the binder layer comprises at least one of nickel, tungsten, silicon, molybdenum, chromium, tin, palladium, and/or alloys thereof. The binder layer may not be used in some embodiments of the coating, but may be used in other embodiments of the coating to improve the adherence of the diamond nanoparticle layers to the cutting element. In various embodiments, the matrix material in which the plurality of diamond nanoparticles are dispersed is one or more of cobalt, tungsten, silicon, molybdenum, chromium, nickel, or other suitable materials.

In another embodiment of the coating, the coating may comprise a pure diamond layer, referred to herein as a "diamond film," that is formed/grown using CVD method. This coating may be applied directly to the diamond table of the cutting element without the use of a binder, and is a polycrystalline diamond structure.

In various embodiments, the coating may be disposed on the diamond table to a total thickness of from about 0.5 μm to about 1.0 mm. In one example, the binder layer, which may be a tin-palladium compound, may be disposed on a leached diamond table, and subsequent coating layers comprising Ni—P and diamond nanoparticles may be disposed on the binder layer. In another example, no binder layer is used and the coating comprises diamond nanoparticles and a metal matrix such as nickel phosphate or other elements or combinations of elements including diamond (carbon), tungsten, silicon, molybdenum, and chromium, and in another example the coating is formed as a diamond layer using a CVD process discussed herein without a metal matrix.

In some embodiments, multiple layers, used in combination with the binder layer or without the binder layer, may be used to form the coating. These layers may each comprise a plurality of diamond nanoparticles dispersed in a matrix. The may be of discreet size ranges or may be overlapping in size ranges. For example, a first layer may comprise a plurality of diamond nanoparticles from about 1 nm to about 50 nm in diameter, and a second layer disposed on the first layer may comprise a plurality of diamond particles from about 40 nm to about 80 nm, or from about 51 nm to about 90 nm, or from about 2 nm to about 30 nm. Similarly, each layer of a coating may comprise a weight percent (wt. %) of diamond nanoparticles from, for example, 5 wt. % of the coating to 50 wt. % of the coating, the weight percent of the layers may be the same, comprise overlapping ranges, or may be different among and between layers. In some embodiments, only one layer comprising a plurality of diamond nanoparticles dispersed in a matrix may be used on a diamond table, with or without a binder layer. In alternate embodiments, two or more layers may be used and may be applied in various orders and repeating patterns to establish a desired thickness, hardness, thermal conductivity, and/or product life.

The coating may be applied to a surface to increase thermal abrasion and/or to increase overall toughness of the cutting element. The coating may also be applied to fill voids (partially or completely), such as those created during removal of catalysts from the cutting element during leaching. The coating may be deposited in all the voids (100%) or a portion of the voids (e.g., less than 100%). The voids may be filled completely or partially with respect to the volume of fill, such that some voids are filled entirely and other voids are filled partially.

In an embodiment, the coating may be deposited by CVD in one or more process steps, and may be employed for multiple purposes including: (1) to shield the diamond table from hazardous (integrity-reducing) materials used in the drilling process and/or those found in the drilling environment; (2) to increase thermal conductivity and thermal resistance of the polycrystalline diamond cutting elements; and (3) to produce cutting elements with improved abrasion resistance.

Figure 1:
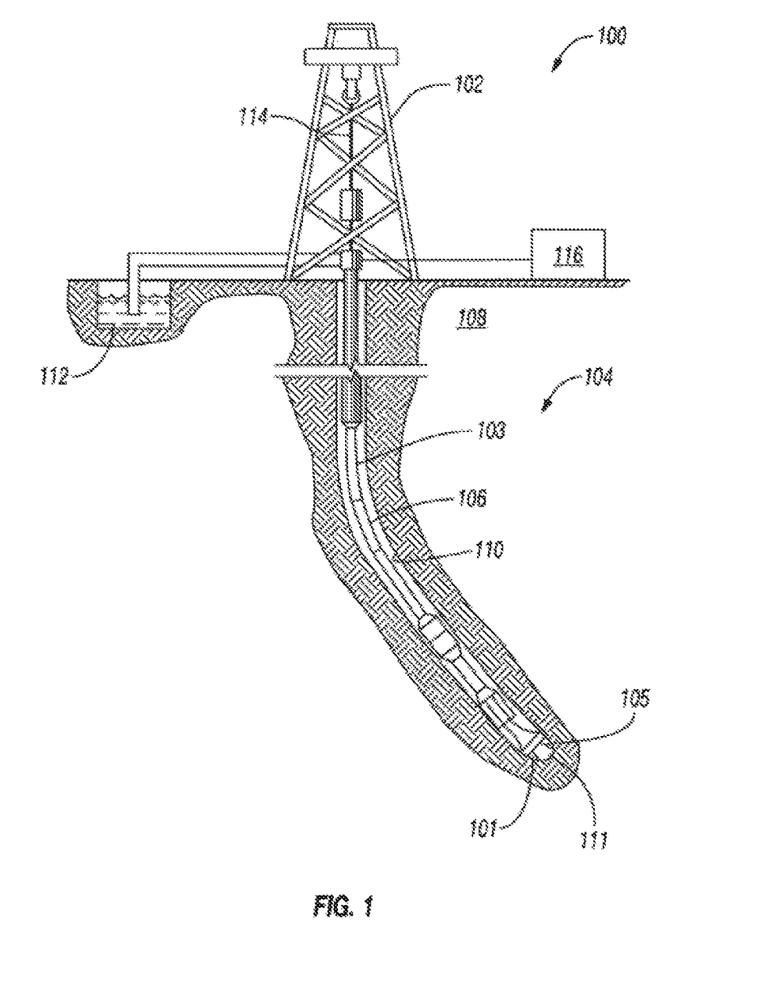
FIG. 1 is a schematic diagram of a wellsite including a rig with a downhole tool having a drill bit advanced into the earth to form a wellbore, the drill bit having cutting elements thereon fabricated according to certain embodiments of the present disclosure.

FIG. 1 depicts an example environment in which a cutting element 101 with coating 111 thereon may be employed. As shown, the wellsite 100 includes a rig 102 for performing various wellbore operations, such as drilling. The wellsite 100 as shown has wellsite equipment including a drill string 103 with a downhole tool (or bottom hole assembly (BHA)) 104 and a drill bit 105 at an end thereof. The drill bit 105 is advanced into a subterranean formation 108 via the drill string 103 to form a wellbore 110.

The drill string 103 may include tubulars (e.g., drill pipe, drill collars, coiled tubing heavy weight drill pipe, rotary substitutes, pup joints, tool joints, or other tubes) 106 deployable downhole to perform downhole operations. The tubulars 106 are connectable in series to form the drill string 103 for the passage of fluid therethrough. A mud pit 112 may be provided at the surface for passing mud through the drill string 103, the downhole tool 104, and out the bit 105.

Various surface (or rig) equipment 114, such as a Kelly, rotary table, top drive, elevator, etc., may be provided at the rig 102 to rotate the drill bit 105. A surface unit 116 is also provided at the surface to operate the wellsite equipment. The downhole tool 104, is deployed from the rig 102 and into the wellbore 110 by the drill string 103 to perform downhole operations.

The downhole tool 104 is at a lower end of the drill string 103 and contains various downhole equipment that may be employed in performing downhole operations. Such equipment may include, for example, motors, measurement tools, electronics, etc. Such downhole equipment may be housed in drill collars or other tubulars. The drill bit 105 is positioned at a downhole end of the drill string 103 and has the coated cutting elements 101 thereon. The cutting elements 101 are provided with coating 111 engageable with the wall of the wellbore 110 to facilitate drilling.

While FIG. 1 depicts a land-based drilling rig with a specific configuration, the cutting elements 101 and/or coating 111 may be usable with a variety of land based, offshore, and/or other wellsite applications involving drilling or other operations. Also, while the cutting elements 101 and/or coating 111 is depicted as being used in a specific wellbore 110 with example wellsite equipment (e.g., the tubular 106, the downhole tool 104, and the drill bit 105), it will be appreciated that the cutting elements 101 and/or coating 111 may be used with various configurations of wellbores and/or wellsite equipment. Additionally, while the coating 111 is depicted on the cutting element 101, the coating 111 may be applied to a variety of equipment, such as the drill bit 105, tubulars 106, and/or other components of the wellsite.

Figure 2A:
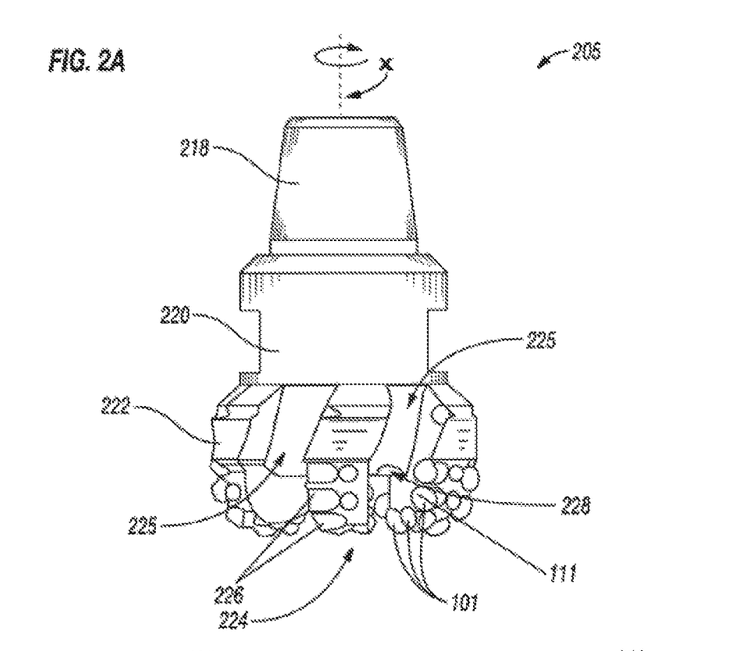
FIGS. 2A and 2B are side and bottom views, respectively, of a fixed cutter drill bit with the cutting elements thereon according to certain embodiments of the present disclosure.
Figure 2B:
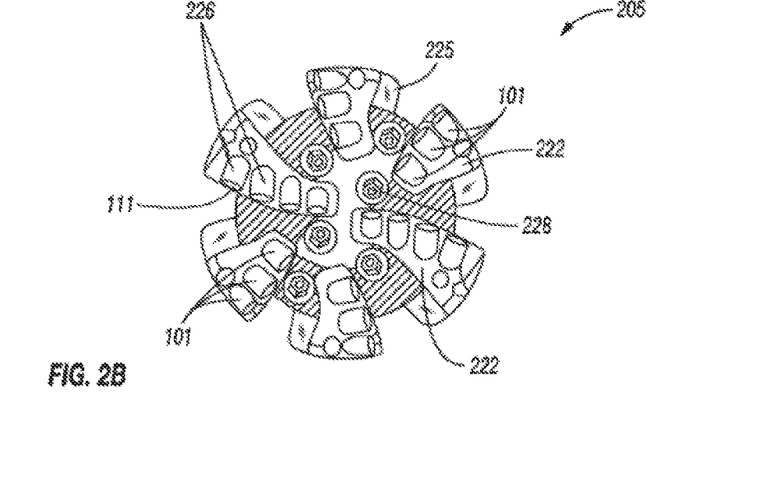

FIGS. 2A and 2B depict an example drill bit 205 that may be used with the cutting elements 101 and coating 111 described herein. The drill bit 205 (and/or portions thereof) may be made of any suitable material, such as tungsten carbide. As shown, the drill bit 205 is a matrix drill bit including a shank 218, a bit body 220, and blades (or ribs) 222. The shank 218 is connectable to the downhole tool (see 104 of FIG. 1) and drivable thereby about an axis X as indicated by the curved arrows. The shank 218 may be provided with threads or other means for connection to the downhole tool.

The blades 222 protrude from an outer surface of the bit body 220 The blades 222 extend along a portion of the bit body 218 and terminate on or near a nose end 224 thereof. The bit body 220 may also be provided with one or more passages 225 between the blades 222 for transporting drilling fluid to the surface of the bit body 218 in order to cool and/or clean exposed portions of the coated cutting elements 101 during drilling operations.

The blades 222 may have sockets 226 thereon. One or more coated cutting elements 101 may be secured in the blades 222 by positioning a portion of each coated cutting element 101 within the sockets 226. The cutting elements 101 may be positioned in the sockets 226 with an exterior end of the cutting element 101 extending from the socket 226 and having the coating 111 thereon. The coated cutting elements 101 may be secured in the sockets 226 (and/or to the drill bit 205) by any suitable means, such as bonding heating, pressure compaction, etc. The coated cutting elements 101 may be positioned in the sockets 226 at a desired orientation.

While FIGS. 2A and 2B depict a matrix (or fixed cutter) drill bit 205, the cutting elements 101 and/or coatings 111 described herein may be used with any drill bit to provide cutting surfaces for engagement with a wellbore during drilling. The selected drill bit 205 may be provided with a variety of shapes, materials, and/or configurations. The drill bit 205 may also be provided with features, such as nozzles 228 for emitting fluid from the drill bit 205.

Figure 3A:
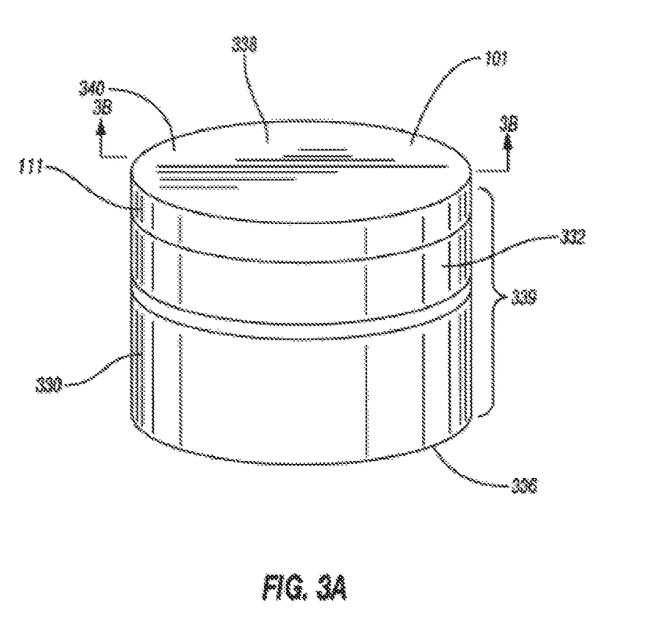
FIGS. 3A and 3B are perspective and cross-sectional views, respectively, of an example cutting element having a coating thereon according to certain embodiments of the present disclosure.
Figure 3B:
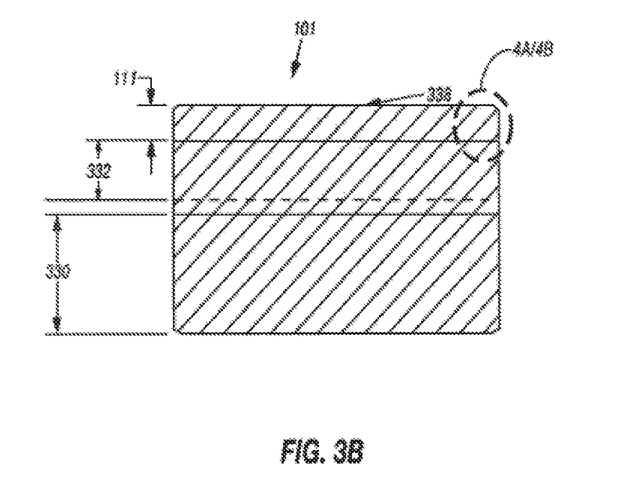
Figure 4A:
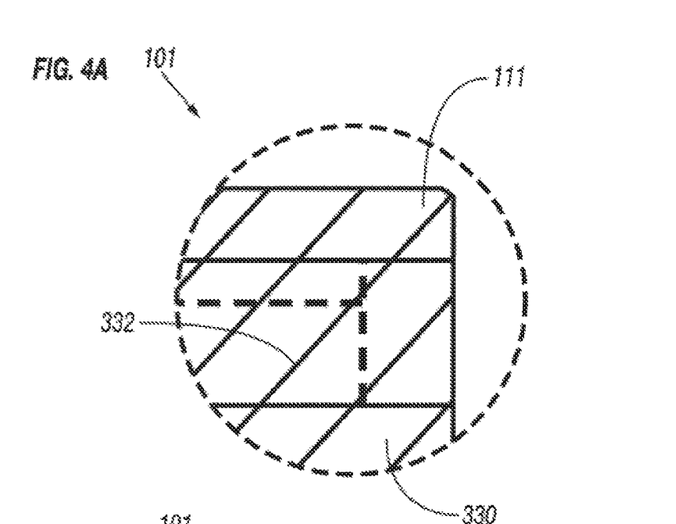
FIGS. 4A-4F are a view and micrographs of a cutting element fabricated according to certain embodiments of the present disclosure.
Figure 4B:
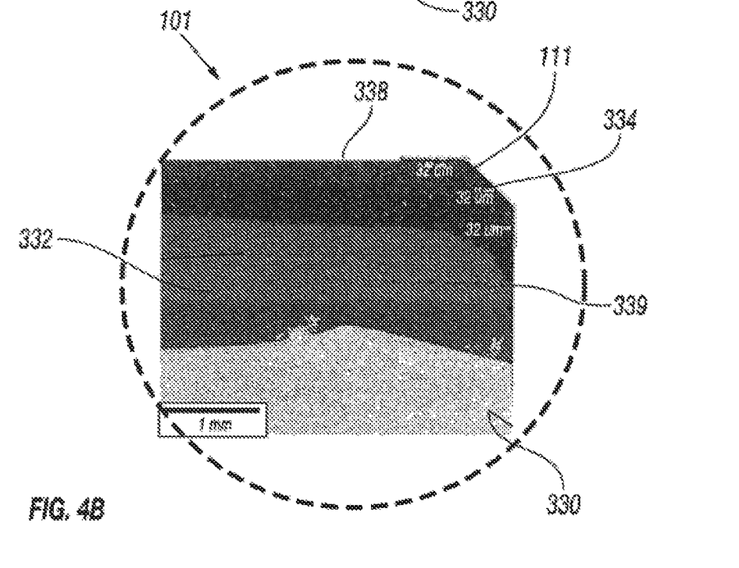
Figure 4C:
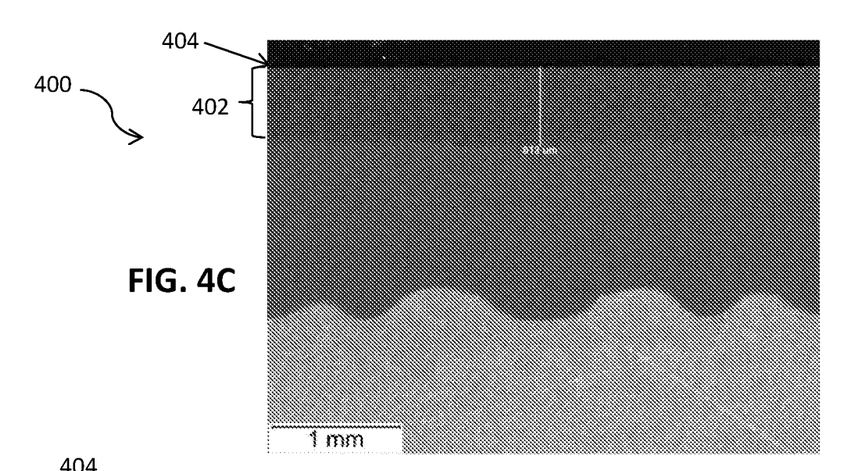
Figure 4D:
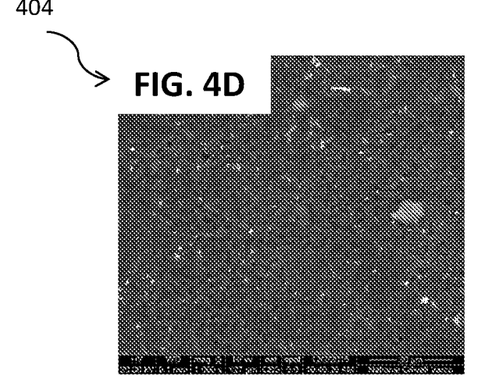
Figure 4E:
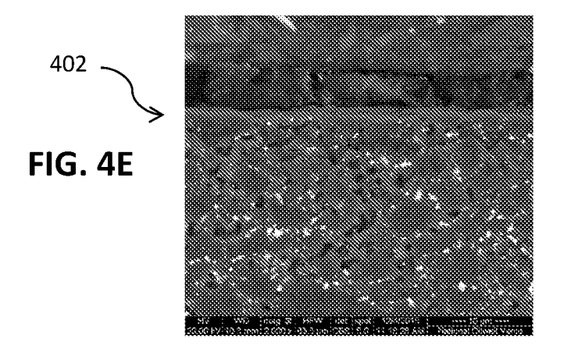
Figure 4F:
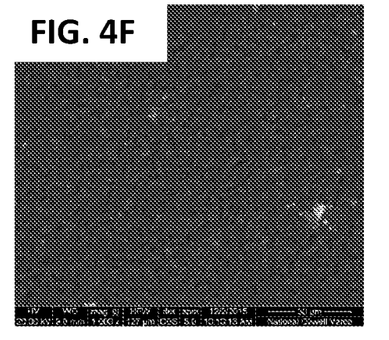

FIG. 3A is a perspective view of an example cutting element 101 with coating 111 thereon. FIG. 3B shows a cross-sectional view of the coated cutting element 101 of FIG. 3A taken along line 3B-3B. FIGS. 4A and 4B show a portion 4A/4B of FIG. 3B in greater detail. FIG. 4A shows a blowup of the cross-section of FIG. 3B. FIG. 4B shows a micrograph of the cross-section of FIG. 3B. FIG. 4C is another micrograph of a cross section of a leached PDC cutting element 400 that does not comprise the diamond film coating. FIG. 4D shows the voids in the top surface 404 of the element 400, and FIG. 4E illustrates the voids in a cross-section of the leached diamond table of the PDC cutting element. FIGS. 4C-4E are intended to illustrate the voids present in both the top (outer surface) 404 of the PDC cutting element 400 and that the voids are present throughout the element 400 as shown by the cross section in FIG. 4E. FIG. 4F is shown in contrast to FIG. 4D, and illustrates the same view as FIG. 4D but shows the top surface 404 of the cutting element 400 after being coated, and the voids (shown as white dots in FIG. 4D) are not as visible or as present in FIG. 4F after filling.

As shown, the coated cutting element 101 is a cylindrical member having an attachment end 336 and a working end 338 with a body 339 therebetween. The attachment end 336 is securable to the drill bit (e.g., in the sockets 226 of the drill bit 205 of FIGS. 2A and 2B). The working end 338 has a working surface 340 thereon. The working surface 340 may be flat as shown, or of other shape.

As shown in FIGS. 3A-4B, the coated cutting element 101 may be provided with a substrate 330, a table 332, and the coating 111. The substrate 330 may be, for example, a hard material (e.g., cemented tungsten carbide) positioned at the attachment end 336 of the coated cutting element 101. The table 332 may be, for example, a diamond material (e.g., polycrystalline diamond) positioned at the working end 338 of the coated cutting element 101. It is appreciated that the coating 111 discussed herein may be applied to a variety of diamond tables, including polycrystalline and nanocrystalline diamond tables of varying sizes, shapes, geometries, and thicknesses.

The coating 111 may be positioned along the working surface 340 and may also extend along at least a portion of the body 339. The coating 111 is depicted as extending from the working surface 338 along a chamfered edge 334 and to a portion of a periphery of the body 339. In this example, the coating 111 is depicted as having a thickness of about 32 microns (μm), but a variety of dimensions may be provided. The coating 111 may be made of a hardened or wear resistant material (e.g., diamond nanoparticles) as is described further herein.

While the cutting element 101 is shown as having specific layers of materials in a specific configuration, the cutting element 101 may be provided with a variety of layers of various shapes and of various materials. For example, additional layers (e.g., intermediate or in situ layers) may be provided between the substrate 330 and the table 332.

Figure 5:
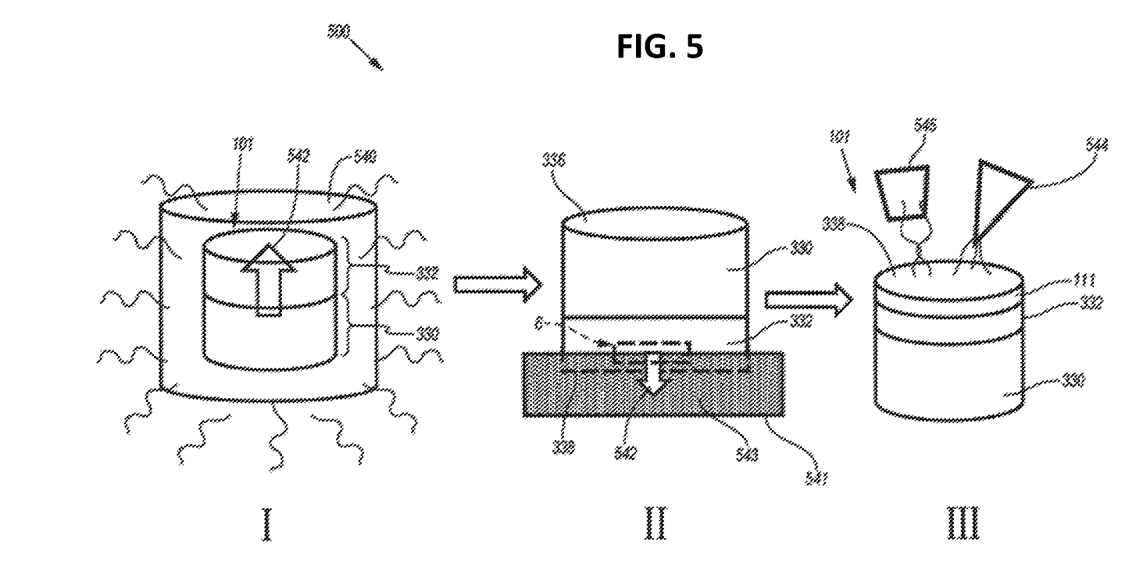
FIG. 5 is a schematic diagram depicting formation of a cutting element according to certain embodiments of the present disclosure.

FIG. 5 schematically depicts an example forming process 500 that may be used to form the cutting element 101. The forming process 500 comprises at least three stages, namely sintering I, leaching II, and coating III, each of which may comprise sub-parts or sub-stages. In the sintering stage I, tungsten carbide (WC) grains and diamond grains are placed in a mold (or can) 540. A catalyst 542, such as cobalt (Co), tungsten (W), molybdenum (Mo), silicon (Si), chromium (Cr), boron (B), and/or other Group VIII elements is also placed in the mold 540. The mold 540 is subjected to high pressure (P) and high temperature (T) are indicated by the wavy lines to form a diamond table by bonding the diamond particles into the solid table 332 and the tungsten carbide into the substrate 330.

Referring back to FIG. 5, in the leaching stage II, the catalyst 542 may optionally be removed from part (or all) of the cutting element 101 using a catalyst removal process, such as leaching. Leaching may be performed, for example, by placing the cutting element 101 in a liquid bath 541 of leaching agent 543 (e.g., nitric acid, sulfuric acid, hydrofluoric acid, hydrochloric acid, or some combination thereof). The cutting element 101 may be positioned such that the leaching agent 543 contacts the diamond table 332 about the working end 338 to remove the catalyst 542 therefrom.

In stage III, the coating 111 may be applied to the working end 338 of the cutting element 101 using an applicator 544. The applicator 544 may be a tool (e.g., welder) capable of, for example, applying the coating 111 by deposition (e.g., chemical vapor, sputtering, plasma, or other coating applicator) and/or or by co-deposits (e.g., by plating in a bath or any other supplementary procedure) onto the table 332. One or more layers may be deposited to form the coating 111. The coating 111 may also be subjected to a thermal cycle for diffusion bonding of bonding materials in the diamond table 332 as indicated by the heat source 545. In example embodiments, the coating 111 may be applied (1) as a first binder layer applied directly to the table 332, followed by at least one layer comprising diamond nanoparticles in a matrix; or (2) as an at least one layer comprising diamond nanoparticles in a matrix applied directly to the table 332; or (3) as a pure diamond film formed on the table 332 without use of a binder or diamond nanoparticles or a matric.

Figure 6:
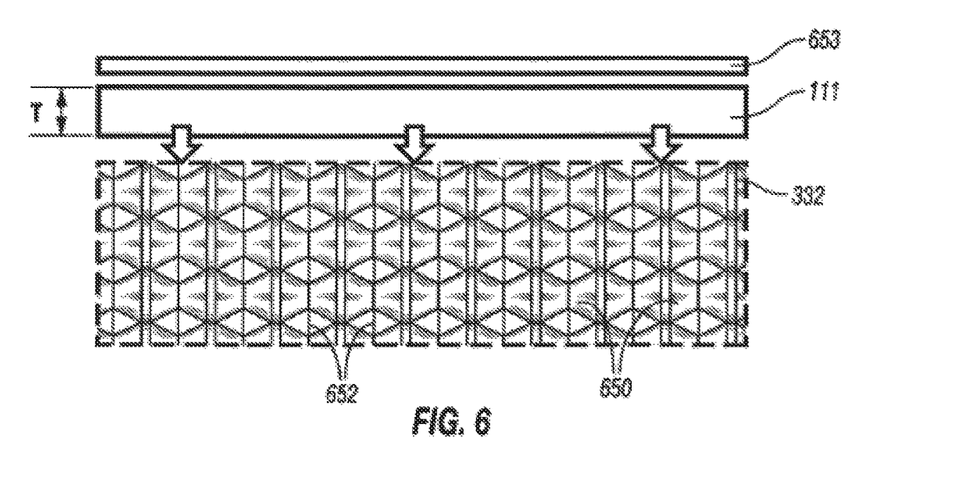
FIG. 6 is a schematic diagram of a portion of the coating of a table of a cutting element according to certain embodiments of the present disclosure

FIG. 6 depicts a detailed view of a portion of the table 332 of FIG. 5 after leaching in stage II and during coating as in stage III. During the sintering in stage I, the diamond grains of the table 332 from FIG. 5 form a matrix of diamond crystals with a catalyst disposed at several of the interstices therein. As shown in FIG. 6, after leaching and removal of the catalyst 542, the diamond table 332 has a grid pattern defined in part by diamond bonds 650 in the diamond table 332 with voids (or void volumes) 652 dispersed between such bonds 650 therein resulting from the removal of the catalyst 542 therefrom. This grid configuration is shown as an interconnected network of bonds 650 of the diamond grains with interstitial voids 652. The voids 652 between diamond to diamond bonds 650 may be described as a volume of air space which may have low thermal conductivity compared to diamond (e.g., air 0.024 W/mK vs. diamond 2000 W/mK), and which may therefore result in poor heat transfer during use of the cutting elements during drilling.

Table 1 depicts thermal conductivity and coefficient of thermal expansion for various materials. These materials may be used alone or in combination with diamond nanoparticles such that the resultant coating has a higher thermal conductivity and lower coefficient of thermal expansion than that of the PDC cutter prior to depositing the coating 111. The coating may be deposited via CVD to fill voids 652 in the diamond table 332.

TABLE 1

THERMAL CONDUCTMTIES AND COEFFICIENTS OF THERMAL EXPANSION FOR VARIOUS MATERIALS AT ROOM TEMPERATURE THERMAL CONDUCTIVITY COEFF THERMAL EXPANSION

|  | Thermal Conductivity (W/mK) | Coeff. Of Therm. Expansion ($\times 10^{-6}$ IN/IN° F.) |
|---|---|---|
| Air | 0.024 | n/a |
| Cobalt | 69 | 6.7 |
| Diamond | 2000 | 0.5 |
| Tungsten | 155 | 2.5 |
| Silicon | 160 | 1.7 |
| Molybdenum | 142 | 2.7 |
| Chromium | 90 | 3.4 |
| Nickel | 91 | 7.2 |

FIG. 6 also shows the coating 111 being applied to the table 332. The coating 111 may also be provided with other features, such as a grapheme shell 653 as schematically shown (e.g., to reduce friction). The coating 111 may be used to keep the drilling mud out of the voids 652, and to improve abrasion, toughness, thermal fatigue, and thermal stability of the face of the cutting element 101. Absent the coating 111, heat built up on the table 332 during use may result in a higher temperature at a cutting edge of the working surface 338 of the table 332. Such heat buildup may tend to graphitize the working surface 338 along the table 332.

Referring back to FIG. 5, during stage II, the leaching agent 543 removes the catalyst 542, leaving behind the bonds 650 and voids 652. During stage III, the coating 111 may be applied to fill the voids 652, thereby increasing heat transfer rates by filling the voids 652 with a coating 111 made of a material which may have a higher thermal conductivity than air. The coating 111 may be applied to the table 332 after leaching to cover the voids 652, thereby providing additional support to the diamond bonds 650 about the table 332.

The coating 111 may be applied to the table 332 with a thickness (T). The thickness T may vary from about 0.5 μm to about 1 mm, and may be thicker than 1 mm depending upon the embodiment. This thickness may be consistent or may vary as it is applied over the table 332. As shown in FIGS. 4A and 4B, the coating may be applied along the working surface 340, for example at the working end 338, on the chamfer 334, and/or on a portion of the body 339.

The coating 111 may be a hard material comprising, for example, diamond nanoparticles may be applied to the working end 338 of the cutting element 101. The coating 111 may also include nickel, tungsten, silicon, molybdenum, chromium, and/or their alloys (and/or other components) to facilitate hardening, void-filling, and/or other characteristics to facilitate drilling. The coating 111 may be made of diamond nanoparticles having a grain size smaller than the diamonds of the table 332 such that the coating is configured to fill voids left by the leaching process. The grain size of the diamond nanoparticles in the coating may range from about 1 nm to about 200 nm, and the weight % (wt. %) of the diamond nanoparticles in the coating may be from about 5% to about 50%.

EXAMPLES

Example 1

In an example, a coating is applied to a cutting element on a leached PCD diamond table positioned on a substrate (see, e.g., the cutting element 101 described herein). The substrate may be fabricated by sintering tungsten carbide powders with about 14 wt. % cobalt powder as a catalyst. The example diamond table includes diamond particles of a size distribution as set forth in the Table 2 below:

TABLE 2

COMPOSITION OF DIAMOND TABLE BY DIAMOND PARTICLE SIZE

| Diamond Size (μm) | Composition (wt. %) |
|---|---|
| 1-3 | 5% |
| 4-6 | 5% |
| 8-16 | 80% |
| 22-36 | 10% |

The diamond table of the sintered cutting element is leached in a liquid bath of a leaching agent to remove catalyst therefrom. The sintered diamond table has a hardness of between about 50 GPa and about 60 GPa. In an embodiment, subsequent to leaching, a coating 111 is then applied the working end 338 of the leached diamond table 332.

Figure 7A:
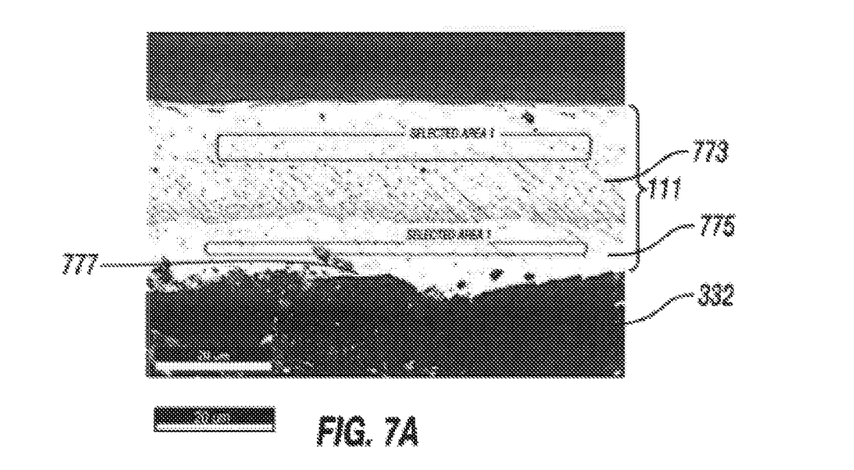
FIG. 7A is a micrograph of a cross section of the coating of a cutting element according to certain embodiments of the present disclosure.

FIG. 7A is a micrograph 700 depicting the coating 111 applied to the diamond table 332. As shown in these views, the coating 111 includes at least three layers, namely a binder layer 777, upper layer 773, and lower layer 775, respectively. The binder layer 777 may be from about 1 μm to about 10 μm, the lower layer 775 may be from about 1 μm to about 10 μm, and the upper layer 773 may be, in some embodiments, 2x-5x the thickness of the lower layer 775. In alternate embodiments, the layers 773 and 775 may be of the same or similar thicknesses. In an embodiment, the binder layer 777 is formed on the working surface of the diamond table 332 after leaching, and may also be described as a catalyst layer 777, not to be confused with the catalyst 542 discussed above. In an embodiment, the binder layer 777 is made of a tin-palladium alloy that helps with the adherence the lower layer 775 to the diamond table 332.

Figure 7B:
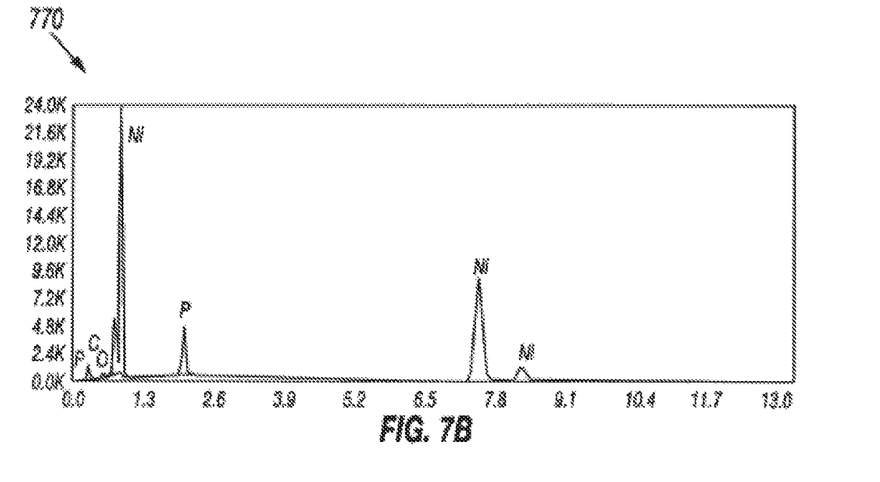
FIGS. 7B and 7C are graphs depicting the compositions of layers of a coating according to certain embodiments of the present disclosure.
Figure 7C:
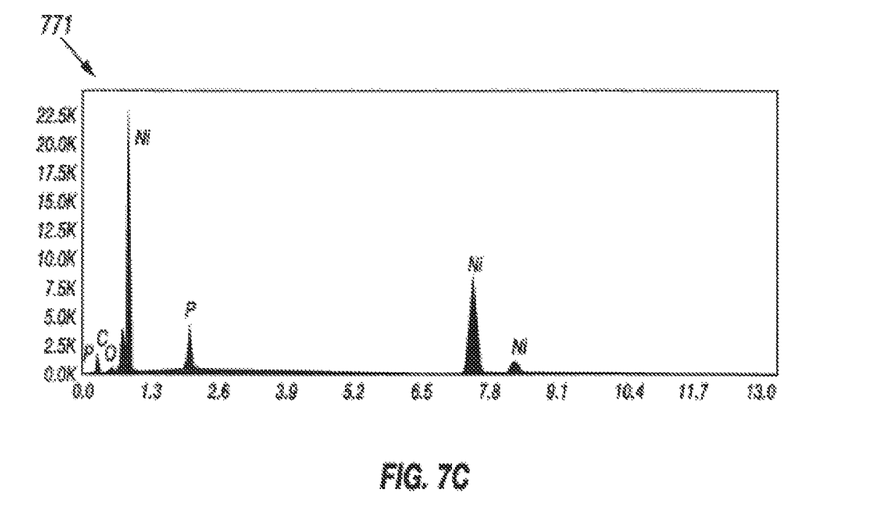

In an embodiment, the upper 773 and lower 775 layers are applied sequentially, and, in some embodiments, the binder layer 777 may not be employed. The layers 773, 775 are formed by deposition using a plating method in some embodiments, of a coating comprising diamond nanoparticles and, for example, a matrix of nickel and phosphate. The coating is disposed as to fill at least a portion of the voids and to bond to the diamond table 332 to improve the thermal conductivity and other functional properties and characteristics of the cutting element 101. The compositions of the coating layers 773 and 775 are shown in Table 3 below and as depicted in FIGS. 7B and 7C:

TABLE 3

WEIGHT PERCENTAGE OF ELEMENTS IN COATING LAYERS

| Element | Nickel | Phosphorous | Carbon | Oxygen |
|---|---|---|---|---|
| Area 773 | 80.24 | 7.56 | 11.02 | 1.18 |
| Area 775 | 69.98 | 6.65 | 21.65 | 1.72 |

FIG. 7B shows graph 770 which depicts the composition of the upper layer 773 and FIG. 7C shows graph 771 which depicts the composition of the lower layer 775. As shown by the graph 770 in FIG. 7B, the upper layer 773 comprises a deposit of diamond nanoparticles (C) with particle size of about 150 nm and Ni—P matrix alloys and is about 20 um thick. As shown by the graph 771 in FIG. 7C the lower layer 775 of coating 111 also comprises a deposit diamond nanoparticles (C) with particle size of about 150 nm and Ni—P matrix alloys and is about 8 um thick, the compositions of the upper layer 773 and the lower layer 775 are different as noted above in Table 3. Depending upon the embodiment, the binder layer 777 may or may not be employed, and the upper layer 773, the lower layer 775, and/or subsequent layers may be of varying thickness and compositions. In an embodiment, the diamond nanoparticles may have a maximum diameter of from about 1 nm to about 200 nm and the weight % (wt %) of the diamond nanoparticles in the upper layer 773 and the lower layer 775 may be from about 5% to about 50%. After coating, the measured hardness of the coated cutting element 101 increases to from about 70 to about 100 GPa.

Figure 9:
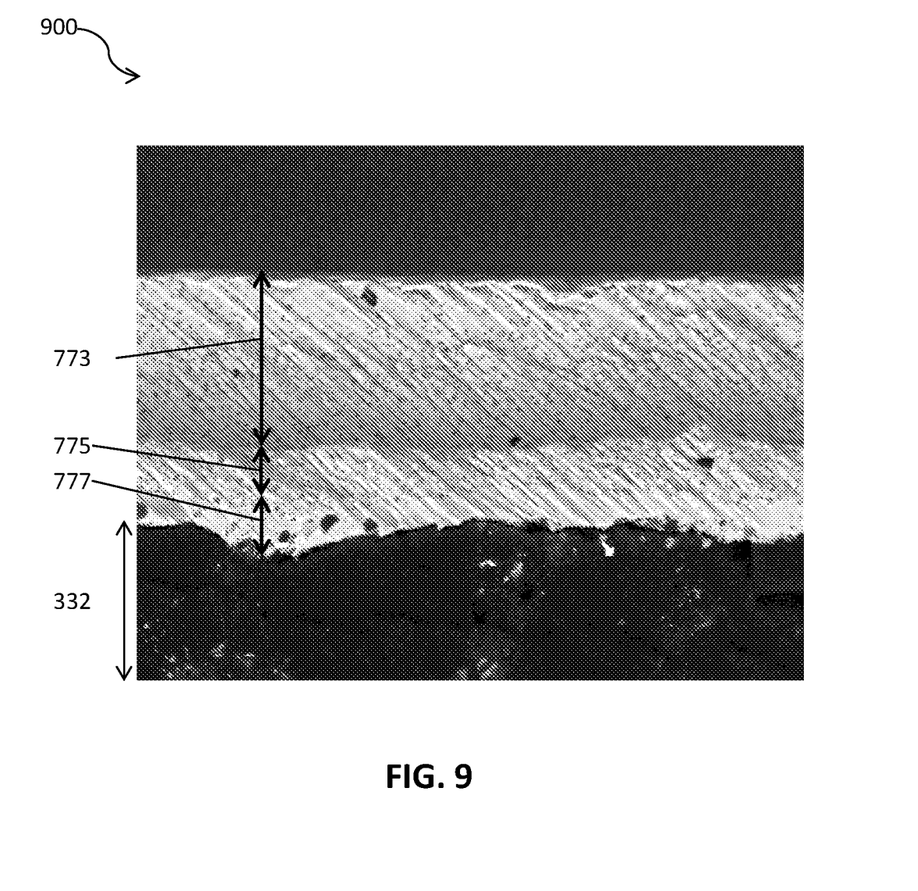
FIG. 9 is a partial cross-sectional micrograph of a coating formed according to certain embodiments of the present disclosure.

FIG. 9 illustrates a partial cross-sectional 900 micrograph of the coating in FIG. 7A. FIG. 9, there is a diamond table 332 with a binder layer 777 that may comprise tin and palladium, a first diamond nanoparticle layer 775 is disposed on the binder layer, and a second diamond nanoparticle layer 773 is disposed on the first layer 775. The average nanoparticle size is about 150 nm in both of the layers 773 and 775, both of which comprise a Ni—P matrix in which the diamond nanoparticles are dispersed, and each layer 773 and 775 comprises about 10 wt. % of diamond nanoparticles.

Example 2

In another example, a coating about 2 μm thick was deposited by CVD on a leached PDC cutter surface, where there was no binder layer employed in the coating. Rather, the coating in this example comprises a diamond layer formed as a film. The formation of the diamond film coating of this example may comprise a CVD process where the diamond film was grown on a crystalline diamond substrate, e.g., the diamond table after leaching, by employing a carbon source such as methane in a predominantly hydrogen plasma which provides the carbon used for growth of the diamond film coating. The hydrogen may be used to prevent graphite growth, and the temperature and pressure are controlled during the CVD process and resulting growth of the diamond film in order to ensure the purity of the diamond film coating, as illustrated in Table 4.

It is to be appreciated that the surfaces of the coated diamond tables discussed herein may be smooth (even) or rough (uneven) depending upon the embodiment. Samples were analyzed to determine the composition of the diamond table surface, uncoated and coated as in examples 1 and 2, as indicated below in Table 4.

TABLE 4

ELEMENTS IN TABLE COMPOSITIONS POST-COATING

| Wt. % | C | Co | W | O | Si | Nb |
|---|---|---|---|---|---|---|
| Uncoated sample | 86.07 | 0.53 | 1.46 | 10.28 | 0.46 | 0.24 |
| Example 1 | 95.58 | 0.24 | — | 3.81 | 0.37 | — |
| Example 2 | 94.27 | | 0.71 | 4.83 | 0.19 | — |

Table 4 shows the results of EDX measurements of the diamond table surfaces that were not coated, as well as tables coated using the coating thicknesses and types discussed above in examples 1 and 2. In an embodiment, after leaching, the PDC cutters may comprise less than about 0.53% Co content, and in other embodiments, the Co content may be up to about 2%. After coating in examples 1 and 2, impurities such as cobalt (Co) were found to be either decreased or not detectable/not present

TABLE 5

VTL DRY TEST PERFORMANCE

|  | VTL increased by | Avg. VTL | Sample #1 | Sample #2 | Sample #3 |
|---|---|---|---|---|---|
| Un-coated | — | 0.7 | 0.67 | 0.85 | 0.58 |
| Test #1 | 6% | 0.74 | 0.64 | 0.97 | 0.61 |
| Test #2 | 40% | 0.98 | 0.91 | 1.01 | 1.03 |

Table 5 illustrates the results of abrasion testing using Vertical Turret Lathe (VTL) testing. Samples from uncoated, example 1, and example 2 CVD-coated diamond tables were tested. The results discussed herein are exemplary results that illustrate at least (1) the voids in the top surface of leached PDC cutters were filled and/or covered by the diamond film coating; (2) EDX scanning confirms that the surface of diamond tables where the diamond film coating was deposited after leaching have less impurities and may in some cases be free from impurities such as cobalt (Co); and (3) after CVD coating, the VTL dry test performance of PDC cutters is improved, for example, by about 40%.

Figure 8:
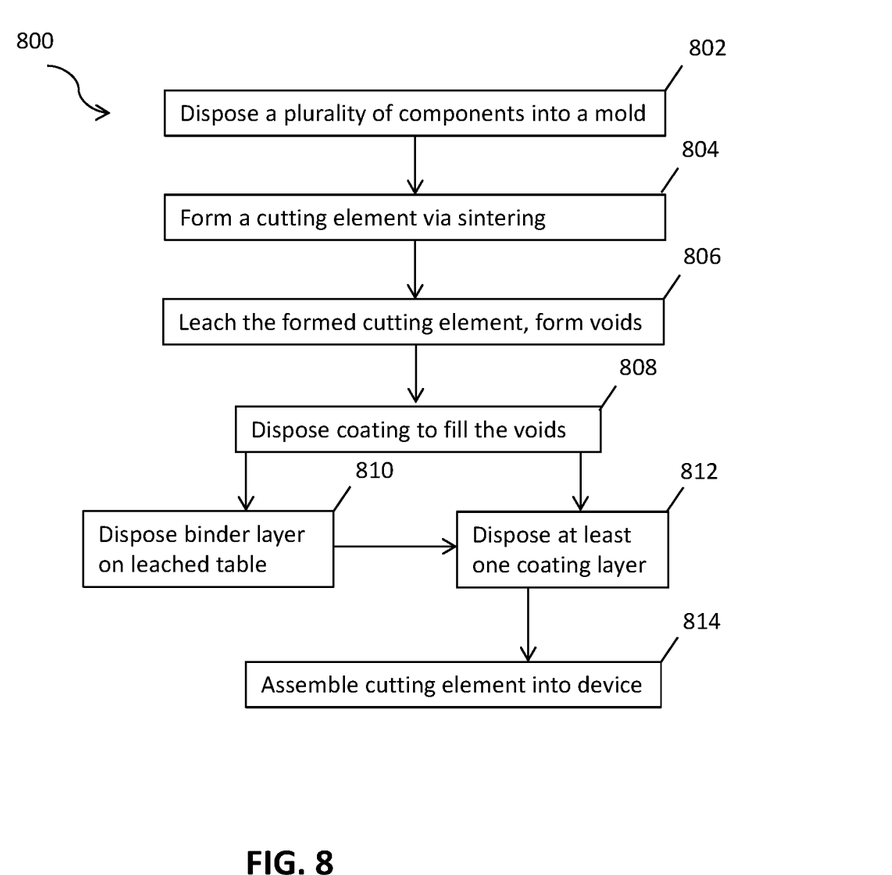
FIG. 8 is a flow chart depicting a method of forming a cutting element according to certain embodiments of the present disclosure according to certain embodiments of the present disclosure.

FIG. 8 is a flow chart illustrating an example method of forming a cutting element comprising a coating. At block 802 of the method 800, a plurality of components such as a substrate that may comprise cemented tungsten carbide is disposed in a mold along with a table material such as diamond (polycrystalline diamond) disposed on the substrate and a catalyst such as cobalt disposed on the diamond. In various embodiments, the catalyst disposed in the mold at block 802 may comprise cobalt in addition to other Group VIII elements, or may comprise other Group VIII elements but not cobalt. The mold materials disposed in the mold at block 802 may include a substrate material, a table material, and a catalyst. The table material includes diamond (e.g., diamond powder). The substrate material comprises a cemented tungsten carbide. The catalyst comprises cobalt (and/or tungsten, molybdenum, silicon, chromium, boron, and/or other Group VIII elements).

At block 804, the mold is sintered to form a cutting element that may be referred to as PCD cutting element, during the sintering at block 804, the catalyst remains in the interstitial spaces between diamond grains, which will reduce thermal stability of the cutting element and accelerate the abrasion wear of the cutting element. Thus, at block 806, the cutting element formed at block 804 is leached to remove some or all of the catalysts. In an embodiment, the leaching at block 806 is performed until the diamond table layer comprises less than about 2% of catalyst content.

At block 808, a coating that may comprise diamond nanoparticles dispersed in at least one matrix may be disposed on the cutting element by, for example, a plating process. This coating may be disposed on an exposed top surface of the cutting element and, in some embodiments, on other portions of the diamond table that may be contact surfaces during the use of the cutting element. The coating, as discussed herein, may comprise diamond nanoparticles from about 1 nm to 200 nm, the size range may be smaller, e.g., from about 1 nm to about 50 nm, or from about 30 nm to about 100 nm, or other ranges of sizes as appropriate for various applications. The matrix may comprise nickel, tungsten, silicon, molybdenum, chromium, tin, palladium, or alloys thereof. Depending upon the embodiment, the binder may comprise one or more elements such as nickel, tungsten, silicon, molybdenum, chromium, tin, palladium, and/or their alloys. In an embodiment, nanoparticles of diamonds may comprise grain sizes in the coating from about 1 nm to 200 nm.

Depending upon the embodiment, at block 808, the coating may be applied, for example by plating or CVD, in sequential layers of a binder at block 810, then a first layer disposed at 812, then subsequent layers may be disposed that comprise diamond nanoparticles disposed in metal matrixes. In some embodiments, the layer or layers disposed/formed at block 812 may comprise diamond nanoparticles disposed in a metal matrix and deposited by plating. In alternate embodiments, the layer formed at block 812 may comprise a pure diamond film grown using, for example, a CVD or plasma-activated (PAVD) process. Thus, the pure diamond film coating therefore does not comprise a plurality of diamond nanoparticles nor a metal matrix.

In some embodiments, one or more layers of coating may be applied at block 812 without a binder, e.g., directly on the diamond table of the cutter. In some examples, this coating may comprise a pure diamond layer formed via a CVD process without employing additional elements, as discussed in example 2 above. In embodiments where more than one layer of diamond nanoparticles is employed, the respective layers may vary in thickness, composition (metal matrix), weight % diamond nanoparticles, and/or the average size or size range of the diamond nanoparticles. At block 814, the coated component formed at blocks 802-812 (and optionally 810) may be assembled into a downhole drilling tool or other device and subsequently employed in operation. The cutting elements, once coated, may have 30-50% increased hardness as compared with uncoated samples.

While the embodiments are described with reference to various implementations and exploitations, it will be understood that these embodiments are illustrative and that the scope of the inventive subject matter is not limited to them. Many variations, modifications, additions and improvements are possible, such as a coating applied to the cutting element. The cutting element and/or coating may have various combinations of the features provided herein. Accordingly, the scope of the disclosure shall be limited only by the claims set out below.

Plural instances may be provided for components, options and structures described herein as a single instance. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

The invention claimed is:

1. A method of forming a cutting element, comprising:
subsequent formation of a cutting element comprising a polycrystalline diamond table, disposing a coating on an least one surface of the cutting element, wherein the at least one surface comprises a plurality of voids in the polycrystalline diamond table, wherein disposing the coating fills at least some of the plurality of voids on the at least one surface, and wherein the coating comprises a layer comprising a plurality of diamond nanoparticles disposed in a matrix, a layer comprising a pure diamond film, or a layer comprising a plurality of diamond nanoparticles disposed in a matrix and a layer comprising a pure diamond film.

2. The method of claim 1, wherein forming the cutting element further comprises:
disposing a polycrystalline diamond material and a catalyst on a substrate;
sintering the substrate, the catalyst, and the polycrystalline diamond material to form the cutting element including the diamond table;
leaching the cutting element;
forming, in response to the leaching, the plurality of voids on at least one outside surface of the cutting element.

3. The method of claim 1, further comprising disposing the coating via chemical vapor deposition (CVD).

4. The method of claim 1, wherein disposing the coating comprises:
disposing a binder layer directly on the at least one outside surface of the cutting element subsequent to leaching.

5. The method of claim 4, wherein the disposing the coating comprises: disposing a first layer on the binder, wherein the first layer comprises a first plurality of diamond nanoparticles disposed in a matrix.

6. The method of claim 5, further comprising disposing a second layer on the first layer, wherein the coating comprises the binder, the first layer, and the second layer.

7. The method of claim 6, wherein the second layer comprises a second plurality of diamond nanoparticles disposed in a matrix.

8. The method of claim 1, wherein the coating comprises a pure diamond film.

9. The method of claim 1, further comprising disposing the coating to obtain a coating thickness from about 0.5 µm to about 1.0 mm.

10. A cutting element comprising:
a polycrystalline diamond table in contact with a tungsten carbide substrate;
a coating disposed on the polycrystalline diamond table subsequent formation of the polycrystalline diamond table, wherein the coating comprises a plurality of diamond nanoparticles disposed in a matrix, and wherein the coating fills at least some of a plurality of voids in the polycrystalline diamond table.

11. The element of claim 10, wherein the coating has a coating thickness from about 0.5 µm to about 1.0 mm.

12. The element of claim 11, wherein the coating further comprises a binder layer disposed on the polycrystalline diamond table, wherein at least one layer comprising the plurality of diamond nanoparticles in the matrix is disposed on the binder layer, and wherein the plurality of diamond nanoparticles are from about 5 wt. % to about 50 wt. % of the at least one layer.

13. The element of claim 12, wherein the binder layer comprises at least one of nickel, tungsten, silicon, molybdenum, chromium, tin, palladium, or alloys thereof.

14. The element of claim 10, wherein each diamond nanoparticle of the plurality of diamond nanoparticles is from about 1 nm to about 200 nm in diameter.

15. The element of claim 10, wherein the matrix comprises at least one of nickel, phosphorous, tungsten, silicon, molybdenum, chromium, or alloys thereof.

16. A downhole drilling tool comprising:
a cutting element comprising:
a polycrystalline diamond table comprising a plurality of voids;
a coating disposed at a thickness from about 0.5 µm to about 1.0 mm on the polycrystalline diamond table subsequent formation of the polycrystalline diamond table, wherein the coating fills at least some of the plurality of voids, wherein the coating comprises a layer comprising a plurality of diamond nanoparticles disposed in a matrix, a layer comprising a pure diamond film, or a layer comprising a plurality of diamond nanoparticles disposed in a matrix and a layer comprising a pure diamond film.

17. The tool of claim 16, wherein the coating comprises a first layer of a plurality of diamond nanoparticles disposed in a matrix and a binder layer, wherein the binder layer is in contact the polycrystalline diamond table and the first layer of the plurality of diamond particles disposed in the matrix is in contact with the binder layer.

18. The tool of claim 17, wherein the coating further comprises a second layer of a plurality of diamond nanoparticles in a matrix layer disposed over the first layer.

19. The tool of claim 18, wherein at least one of:
the first layer comprises a different thickness than a thickness of the second layer, or
the first layer comprises a different matrix than the matrix of the second layer, or
an average particle size of the first plurality of diamond nanoparticles in the first layer is different than an average particle size of the second plurality of diamond nanoparticles, or
a weight percent of the first plurality of diamond nanoparticles in the first layer is different than a weight percent of the second plurality of diamond nanoparticles in the second layer.

20. The tool of claim 16, wherein the coating comprises a pure diamond film.

* * * * *